United States Patent
Leuker et al.

(10) Patent No.: US 9,835,725 B2
(45) Date of Patent: Dec. 5, 2017

(54) LIGHT SENSING DEVICE

(71) Applicant: SICK AG, Waldkirch (DE)

(72) Inventors: Gunter Leuker, Waldkirch (DE); Patrick Bornstein, Waldkirch (DE)

(73) Assignee: SICK AG, Waldkirch (DE)

( * ) Notice: Subject to any disclaimer, the term of this patent is extended or adjusted under 35 U.S.C. 154(b) by 384 days.

(21) Appl. No.: 14/669,022

(22) Filed: Mar. 26, 2015

(65) Prior Publication Data

US 2015/0285914 A1 Oct. 8, 2015

(30) Foreign Application Priority Data

Apr. 8, 2014 (DE) .......................... 10 2014 104 968

(51) Int. Cl.

| | |
|---|---|
| *G01S 17/48* | (2006.01) |
| *G01V 8/12* | (2006.01) |
| *G01S 17/02* | (2006.01) |
| *G01S 7/51* | (2006.01) |
| *H03K 17/94* | (2006.01) |
| *G01C 3/08* | (2006.01) |
| *G01S 17/08* | (2006.01) |

(52) U.S. Cl.
CPC ................ *G01S 17/48* (2013.01); *G01C 3/08* (2013.01); *G01S 7/51* (2013.01); *G01S 17/026* (2013.01); *G01V 8/12* (2013.01); *H03K 17/941* (2013.01); *G01S 17/08* (2013.01); *H03K 2217/94108* (2013.01)

(58) Field of Classification Search
CPC .................................. G01C 25/00; G01C 3/08
See application file for complete search history.

(56) References Cited

U.S. PATENT DOCUMENTS

| | | | | |
|---|---|---|---|---|
| 4,920,412 A | * | 4/1990 | Gerdt | G01S 17/107 348/31 |
| 2010/0245800 A1 | * | 9/2010 | Brown | G01C 3/08 356/4.02 |
| 2013/0070239 A1 | * | 3/2013 | Crawford | G01S 17/66 356/139.04 |

FOREIGN PATENT DOCUMENTS

| | | |
|---|---|---|
| DE | 10 2010 021 807 A1 | 12/2011 |
| DE | 10 2014 104 968 B3 | 12/2014 |

OTHER PUBLICATIONS

Office Action issued in German Application 10 2014 104 968.3 dated Oct. 9, 2014 (Oct. 9, 2014).

* cited by examiner

*Primary Examiner* — Luke D Ratcliffe
(74) *Attorney, Agent, or Firm* — Nath, Goldberg & Meyer; Jerald L. Meyer

(57) ABSTRACT

A light sensing device having background suppression includes: a light transmitter, a light receiver, an evaluation unit for determining the spacing between the light sensing device and an object in a detection zone of the light sensing device, and a setting element for setting a sensing depth within which an object should be detected. A critical spacing region is defined between a set sensing depth and a background in dependence on the set sensing depth. A signal output outputs a signal if an object is detected within the set sensing depth and a display unit displays whether an object is present within the sensing depth. The set sensing depth can be displayed in relation to a maximum sensing depth of the light sensing device in a first display region and a second display region indicates if an object is located in the critical spacing region.

10 Claims, 5 Drawing Sheets

LIGHT SENSING DEVICE

Figure 1A:
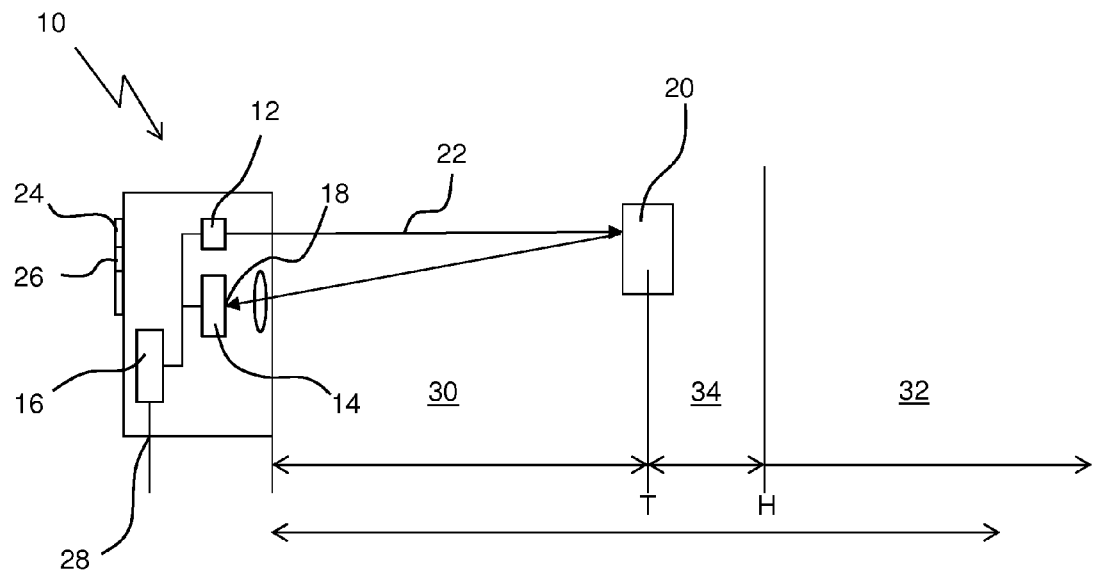

The invention relates to a light sensing device having background suppression in accordance with the preamble of the claim 1.

The setting of the maximum switching distance (sensing depth) for light sensing devices of this kind either takes place using a potentiometer, a teaching button, externally through a teaching line or by means of a display indicator. The set sensing depth can be displayed at a display, for example, by means of showing the distance in millimeters or by displaying whether a threshold value is undercut or exceeded. When an object is located outside of the respective sensing depth then this is not additionally indicated.

Having regard to the sensing depth setting, the user does not receive a direct feedback at the sensor of whether the required minimum distance (critical spacing region) is maintained between the sensing depth and the background. This minimum distance is required as, on the one hand, objects located within the sensing depth should be securely recognized and, on the other hand, objects which are present in the background should be reliably suppressed. The required minimum spacing between the set sensing depth and the background can only be obtained from documentation (data sheet, operating manual) provided for the light sensing device and has to be measured again at the place of implementation.

In view of the foregoing it is the object of the invention to make available an improved light sensing device by means of which the aforementioned disadvantages can be avoided and by means of which an, in particular improved, setting of the sensing depth, object detection display and an improved consideration of the critical spacing region is enabled.

This object is satisfied by a light sensing device having the features of the claim 1.

The light sensing device in accordance with the invention having background suppression, comprises a light transmitter, a light receiver, an evaluation unit for determining the spacing between the light sensing device and an object in a detection zone of the light sensing device, a setting element for setting a sensing depth within which an object should be detected, wherein a critical spacing region is defined between a set sensing depth and a background in dependence on the set sensing depth, a signal output for outputting a signal when an object is detected within the set sensing depth and a display unit for displaying whether an object is present within the sensing depth, wherein the display unit has at least two display regions, wherein the first display region is configured such that the set sensing depth can be indicated in relation to a maximum sensing depth of the light sensing device and the second display region indicates if an object is present in the critical spacing region.

Thereby the user receives a direct feedback at the sensor on a taking into operation thereof, of whether the sensing depth was correctly set or whether the maximum sensing depth has possibly been exceeded. The user also receives a feedback during the operation of whether objects are present in the critical spacing region which could interfere with a secure detection. Namely if an object is detected between the set sensing depth and the background then this is indicated in the second display region. The object to be detected then lies outside the sensing depth and it is present in the critical spacing region and could interfere with the secure detection. During the operation it can thereby be determined, in an improved manner, at the display unit in which spacing region an object is detected.

By means of the light sensing device in accordance with the invention the maintenance of the specified maximum sensing depth can be checked on a taking into operation. On exceeding this, this is directly indicated by the display unit during the setting.

A continuous display of whether the objects to be detected are present within the set sensing region, or in a different region, is advantageously brought about by means of the invention during an operation thereof. It can in particular be identified whether undesired objects that should not be detected are present in the critical spacing region. A direct feedback of the aforementioned situation to the user takes place directly at the light sensing device and without the aid of the documentation or of an external evaluation device.

Thus, the invention makes available a simple and direct feedback and/or information on the light sensing device with regard to the quality of the set sensing depth and the detection conditions for the user. The demand in effort and cost for external evaluation devices or the laborious measurement with the aid of the documentation of the light sensing device is omitted.

In an embodiment of the invention a third display region is provided in which it can be indicated whether a detected object is present in the background. In this way the spacing region can be recognized more clearly and visualized already at the display unit and a mapping of an object in the detection zone of the light sensing device can be clearly associated with a spacing region.

In an embodiment of the invention the distance of a detected object within the set sensing depth can be indicated in a qualitative manner in the first display region in such a way that the user already has an idea of the approximate position of the object within the sensing depth by looking at the display.

In an advantageous manner the first display region is composed of a plurality of LEDs, wherein an activated portion of the LEDs indicates the set sensing depth. In this way the set working region of the light sensing device can be recognized in a simple manner in relation to the maximum working zone (maximum sensing depth).

Using this design the distance of the object within the set sensing depth can be indicated in a simple manner, by means of a going off of one of the activated LEDs which is associated with the spacing of the object. This is true both for the first time setting of the sensing depth (taking into operation) as well as during the operation.

Advantageously a setting mode for setting the sensing depth can be activated, for example by means of a start button or a start command. An end of the setting mode is automatically recognized by the evaluation unit if the setting element has not been actuated for a predefined period of time. This is very user-friendly and simplifies the operability thereof.

In an optically appealing manner the display unit is of ring-like design and the display regions form sections of the ring. At the same time such a display is of space saving design, such that it can also be used for small construction sizes.

In an advantageous and space-saving manner the setting element is configured as a rotary potentiometer that is located in the interior of the ring. Instead of the potentiometer also a single teach or double teach button could be provided.

The light sensing device can be configured as a triangulation light sensing device. Triangulation light sensing devices are known, are tried and tested and can be produced in a fairly cost-effective manner. Alternatively, also other technologies for the measurement of the distance can be used. For example, the light sensing device could also be configured as a TOF sensing device (Time-Of-Flight), with the light transmitter then transmitting modulated light and the evaluation unit determining the distance via a determination of the light propagation time.

Figure 1B:
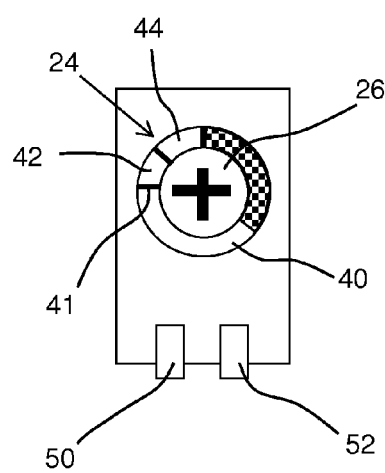
Figure 4:
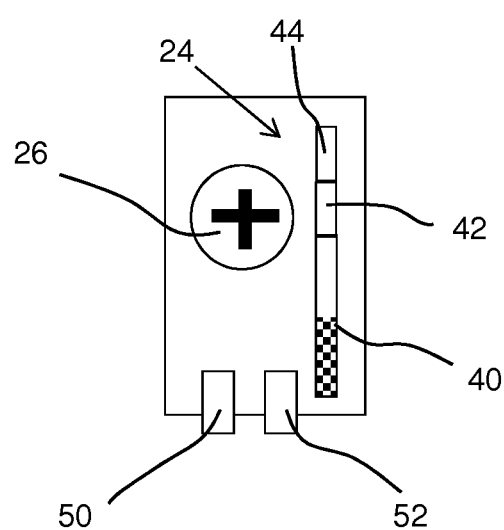
Figure 5:
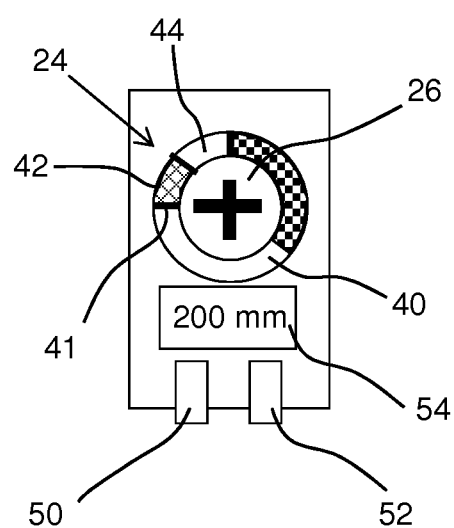

In the following the invention will be described in detail by means of embodiments with reference to the drawing. In the drawing there is shown:

FIG. 1a a schematic illustration of a light sensing device in accordance with the invention in an application situation having an object within the sensing depth;

FIG. 1b a display unit in the application situation in accordance with FIG. 1a;

FIGS. 2a to 3b illustrations like FIG. 1a or FIG. 1b respectively having different object distances;

FIGS. 4 and 5 embodiments of the display unit.

A light sensing device 10 in accordance with the invention and illustrated in FIG. 1, comprises a light transmitter 12 and a light receiver 14 that are connected to an evaluation unit 16. The light sensing device 10 is configured as a triangulation light sensing device in this embodiment, wherein the position of the point of incidence 18 of a light beam 22 of the light transmitter 12 reflected at an object 20 in the detection region and incident on the light receiver 14 is established in the evaluation unit and the spacing d between the light transmitter 10 and the object 20 is determined by means of the position.

Furthermore, the light sensing device 10 has a display unit 24 and at least one setting element 26. A sensing depth T can be set by means of the setting element 26. The sensing depth T is that spacing up to which the object 20 should be detected and in this way defines a sensing region 30. When the object 20 is thus present in the sensing region 30 having a spacing d smaller than or equal to T, the light sensing device 10 outputs a switching signal at its output 28.

When an object is present in the background 32 then this object should be ignored and no switching signal should be output. The background 32 is that region in which a spacing d is larger than H. The background 32, in which the objects can be suppressed securely, thus has a spacing H-T from the sensing region 30 in which an object 20 should be securely detected. This region between the set sensing depth T and background is a critical spacing region 34. No object should be present there, as then no clear association with respect to the sensing region 30 or the background 32 can be guaranteed.

An essential element of the invention is the display unit 24. In a first embodiment of the invention (FIG. 1a to 3b) the display unit 24 is of circular design and comprises three display regions 40, 42 and 44 which are respectively of circular arc design and are preferably formed by LED elements. The display unit can also be configured in the form of a so-called "electronic paper" (in color or in black and white).

The display regions correspond to the spacing regions, wherein the first display region 40 corresponds to the sensing region 30, the second display region corresponds to the critical spacing region 34 and the third display region 44 corresponds to the background.

In the first display region 40 the set sensing depth T can be initially indicated in relation to a maximum settable sensing depth of the light sensing device 10. This can be recognized in FIG. 1b. The checkered region of the first display region 40 should represent an illumination, preferably by means of activated LED elements.

The extent of this illuminated region represents the set sensing depth T in reaction to the maximum settable sensing depth that is represented by the complete first display region. The display boundary of the maximum possible sensing depth would thus be at reference numeral 41. In the example according to FIG. 1b the set sensing depth T amounts to approximately half of the maximum settable sensing depth.

Figure 2A:
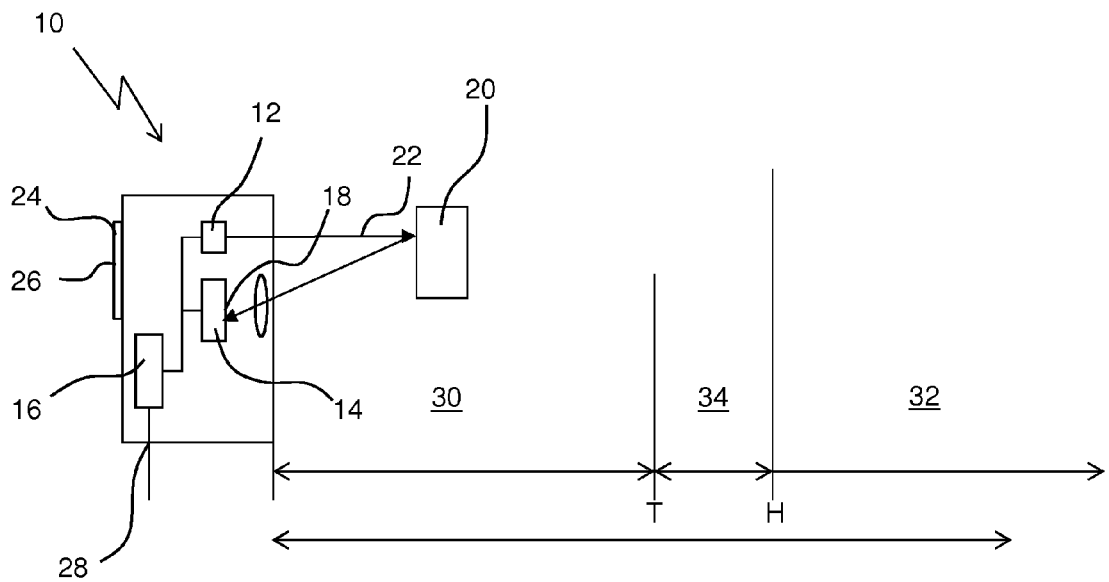
Figure 2B:
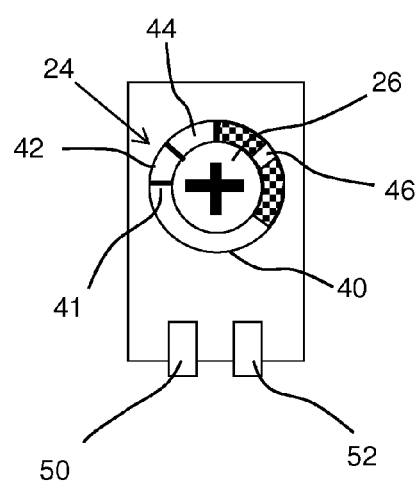

If the object 20 is now present within the set sensing depth T, as is e.g. illustrated in FIG. 2a, then this is illustrated by an LED associated with the spacing of the object 20 going off in the first display region 40, as can be recognized at the position 46 in FIG. 2b. In this way at least one qualitative display of the distance is possible.

If the object 20 is present in the critical spacing region 34 then this is indicated by the lighting up of the second display region 42, in that the LED or LEDs present there are activated.

Figure 3A:
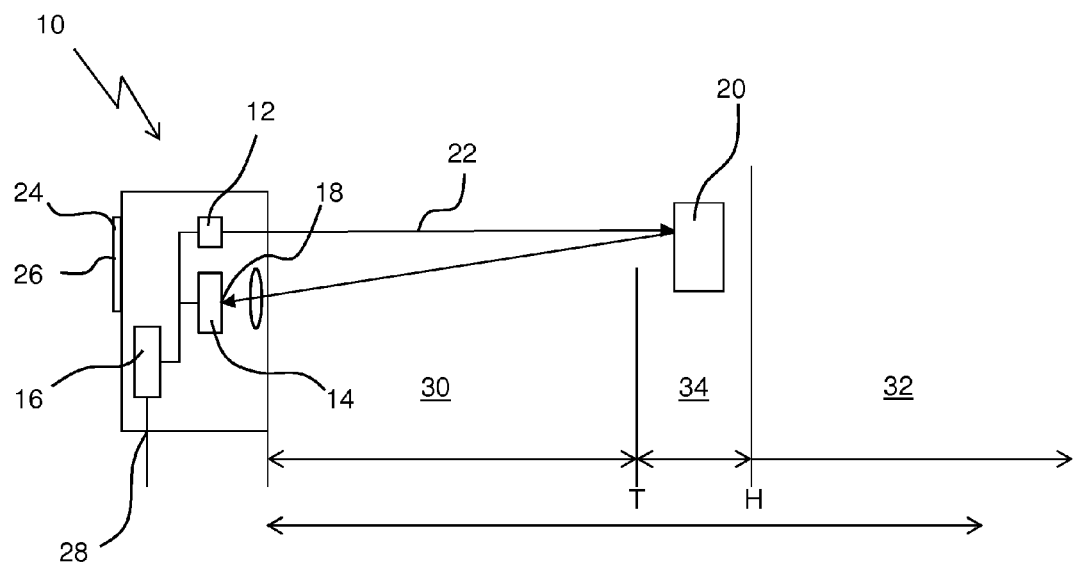
Figure 3B:
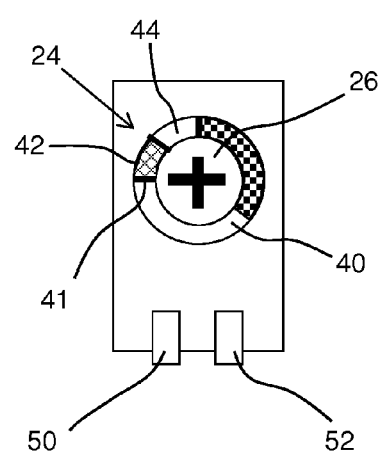

In the third display region 44 it is finally indicated if an object 20 is present in the background, this means at a spacing that is larger than H (see FIG. 3).

In these embodiments the setting element 26 is positioned in the middle of the circular display unit 24 and comprises a rotary potentiometer that can, for example, be actuated by means of a cross-headed screwdriver. The setting element 26 serves for the setting of the sensing depth T, after a setting mode was previously activated, for example, by means of a non-illustrated starting button or a starting command. An end of the setting mode is automatically recognized by the evaluation unit 16 when the setting element 26 has not been actuated for a predefined period of time.

In an alternative embodiment illustrated in FIG. 4 the display unit could also be configured of bar-like design such that the individual display regions 40, 42, 44 are respectively configured as bar graphs. The functions of the bar graphs are the same as for the first embodiment.

In an alternative embodiment illustrated in FIG. 5 the display unit 24 could also be configured as a so-called "electronic paper" having display regions 40, 42, 44 like in the aforementioned embodiments.

In an embodiment of the invention the set sensing depth can be indicated in an additional display 54. The display can display the sensing depth digitally as a value in millimeters or in inches as a digital display or as an "electronic paper".

In an embodiment of the invention the display regions can have different colors. Thus, for example, the first display region 40 can be represented by green LEDs (function ok, sensing depth set), the second display region 42 can be represented by yellow (object in the critical spacing region) and the third display region 44 can be represented by blue or white (objects in the background).

Furthermore, two further display LEDs 50 and 52 can be provided, wherein LED 50 can indicate the status of the signal output 28 and the LED 52 can indicate whether an operating voltage is present.

What is claimed is:

1. A light sensing device having background suppression, comprising
   a light transmitter;
   a light receiver;
   an evaluation unit for determining the spacing between the light sensing device and an object in a detection zone of the light sensing device;
   a setting element for setting a sensing depth within which an object should be detected, wherein a critical spacing region is defined between a set sensing depth and a background in dependence on the set sensing depth;

a signal output for outputting a signal when an object is detected within the set sensing depth;

a display unit for displaying whether an object is present within the sensing depth;

wherein the display unit has at least two display regions, wherein the first display region is configured such that the set sensing depth can be displayed in relation to a maximum sensing depth of the light sensing device and the second display region indicates if an object is present in the critical spacing region; and wherein the display unit is of ring-like design and the display regions form sections of the ring and the setting element is configured as a rotary potentiometer which is present in the interior of the ring.

2. The light sensing device in accordance with claim 1, further comprising a third display region in which it can be indicated whether a detected object is located in the background.

3. The light sensing device in accordance with claim 1, wherein a distance of an object located within the set sensing depth can be indicated qualitatively in the first display region.

4. The light sensing device in accordance with claim 1, wherein the first display region is composed of a plurality of LEDs, wherein an activated portion of the LEDs indicates the set sensing depth.

5. The light sensing device in accordance with claim 4, wherein a distance of an object located within the set sensing depth can be indicated by a going off of one of the activated LEDs which is associated with the distance of the object.

6. The light sensing device in accordance with claim 1, wherein a setting mode for setting the sensing depth can be activated and an end of the setting mode is automatically recognized by the evaluation unit when the setting element has not been actuated over a predefined period of time.

7. The light sensing device in accordance with claim 1, wherein the display unit is configured as a bar graph.

8. The light sensing device in accordance with claim 1, wherein the display unit has a display for the set sensing depth.

9. The light sensing device in accordance with claim 1, wherein this is configured as a triangulation light sensing device.

10. The light sensing device in accordance with claim 1, wherein the light transmitter transmits modulated light and the evaluation unit determines the distance via a determination of the light propagation time.

* * * * *